US007738093B2

(12) United States Patent
Alles et al.

(10) Patent No.: US 7,738,093 B2
(45) Date of Patent: Jun. 15, 2010

(54) METHODS FOR DETECTING AND CLASSIFYING DEFECTS ON A RETICLE

(75) Inventors: David Alles, Los Altos, CA (US); Mark Wihl, Tracy, CA (US); Stan Stokowski, Danville, CA (US); Yalin Xiong, Union City, CA (US); Damon Kvamme, Los Gatos, CA (US)

(73) Assignee: KLA-Tencor Corp., San Jose, CA (US)

( * ) Notice: Subject to any disclaimer, the term of this patent is extended or adjusted under 35 U.S.C. 154(b) by 214 days.

(21) Appl. No.: 12/115,833

(22) Filed: May 6, 2008

(65) Prior Publication Data

US 2008/0304056 A1 Dec. 11, 2008

Related U.S. Application Data

(60) Provisional application No. 60/916,356, filed on May 7, 2007.

(51) Int. Cl.
*G01N 21/00* (2006.01)

(52) U.S. Cl. ...................... 356/237.5; 382/145; 382/148

(58) Field of Classification Search ............... 356/237.5; 382/145, 148
See application file for complete search history.

(56) References Cited

U.S. PATENT DOCUMENTS

| 3,495,269 | A | 2/1970 | Mutschler et al. |
| 3,496,352 | A | 2/1970 | Jugle |
| 3,909,602 | A | 9/1975 | Micka |
| 4,015,203 | A | 3/1977 | Verkuil |
| 4,247,203 | A | 1/1981 | Levy et al. |
| 4,347,001 | A | 8/1982 | Levy et al. |
| 4,378,159 | A | 3/1983 | Galbraith |
| 4,448,532 | A | 5/1984 | Joseph et al. |
| 4,532,650 | A | 7/1985 | Wihl et al. |
| 4,555,798 | A | 11/1985 | Broadbent, Jr. et al. |
| 4,578,810 | A | 3/1986 | MacFarlane et al. |
| 4,579,455 | A | 4/1986 | Levy et al. |

(Continued)

FOREIGN PATENT DOCUMENTS

EP 0032197 7/1981

(Continued)

OTHER PUBLICATIONS

Allan et al., "Critical Area Extraction for Soft Fault Estimation," IEEE Transactions on Semiconductor Manufacturing, vol. 11, No. 1, Feb. 1998.

(Continued)

*Primary Examiner*—Roy Punnoose
(74) *Attorney, Agent, or Firm*—Ann Marie Mewherter

(57) ABSTRACT

Methods for detecting and classifying defects on a reticle are provided. One method includes acquiring images of the reticle at first and second conditions during inspection of the reticle. The first condition is different than the second condition. The method also includes detecting the defects on the reticle using one or more of the images acquired at the first condition. In addition, the method includes classifying an importance of the defects detected on the reticle using one or more of the images acquired at the second condition. The detecting and classifying steps are performed substantially simultaneously during the inspection.

21 Claims, 1 Drawing Sheet

U.S. PATENT DOCUMENTS

| | | | |
|---|---|---|---|
| 4,595,289 A | 6/1986 | Feldman et al. | |
| 4,599,558 A | 7/1986 | Castellano et al. | |
| 4,633,504 A | 12/1986 | Wihl | |
| 4,641,353 A | 2/1987 | Kobayashi | |
| 4,641,967 A | 2/1987 | Pecan | |
| 4,734,721 A | 3/1988 | Boyer et al. | |
| 4,758,094 A | 7/1988 | Wihl | |
| 4,766,324 A | 8/1988 | Saadat et al. | |
| 4,799,175 A | 1/1989 | Sano et al. | |
| 4,805,123 A | 2/1989 | Specht et al. | |
| 4,812,756 A | 3/1989 | Curtis et al. | |
| 4,814,829 A | 3/1989 | Kosugi et al. | |
| 4,817,123 A | 3/1989 | Sones et al. | |
| 4,845,558 A | 7/1989 | Tsai et al. | |
| 4,877,326 A | 10/1989 | Chadwick et al. | |
| 4,926,489 A | 5/1990 | Danielson et al. | |
| 4,928,313 A | 5/1990 | Leonard et al. | |
| 5,046,109 A | 9/1991 | Fujimori et al. | |
| 5,189,481 A | 2/1993 | Jann et al. | |
| 5,444,480 A | 8/1995 | Sumita | |
| 5,453,844 A | 9/1995 | George et al. | |
| 5,459,520 A | 10/1995 | Sasaki | |
| 5,481,624 A | 1/1996 | Kamon | |
| 5,485,091 A | 1/1996 | Verkuil | |
| 5,528,153 A | 6/1996 | Taylor et al. | |
| 5,544,256 A | 8/1996 | Brecher et al. | |
| 5,563,702 A | 10/1996 | Emery et al. | |
| 5,572,598 A | 11/1996 | Wihl et al. | |
| 5,578,821 A | 11/1996 | Meisberger et al. | |
| 5,594,247 A | 1/1997 | Verkuil et al. | |
| 5,608,538 A | 3/1997 | Edgar et al. | |
| 5,619,548 A | 4/1997 | Koppel | |
| 5,621,519 A | 4/1997 | Frost et al. | |
| 5,644,223 A | 7/1997 | Verkuil | |
| 5,650,731 A | 7/1997 | Fung | |
| 5,661,408 A | 8/1997 | Kamieniecki et al. | |
| 5,689,614 A | 11/1997 | Gronet et al. | |
| 5,694,478 A | 12/1997 | Braier et al. | |
| 5,696,835 A | 12/1997 | Hennessey et al. | |
| 5,703,969 A | 12/1997 | Hennessey et al. | |
| 5,737,072 A | 4/1998 | Emery et al. | |
| 5,742,658 A | 4/1998 | Tiffin et al. | |
| 5,754,678 A | 5/1998 | Hawthorne et al. | |
| 5,767,691 A | 6/1998 | Verkuil | |
| 5,767,693 A | 6/1998 | Verkuil | |
| 5,771,317 A | 6/1998 | Edgar | |
| 5,773,989 A | 6/1998 | Edelman et al. | |
| 5,774,179 A | 6/1998 | Chevrette et al. | |
| 5,795,685 A | 8/1998 | Liebmann et al. | |
| 5,834,941 A | 11/1998 | Verkuil | |
| 5,852,232 A | 12/1998 | Samsavar et al. | |
| 5,866,806 A | 2/1999 | Samsavar et al. | |
| 5,874,733 A | 2/1999 | Silver et al. | |
| 5,884,242 A | 3/1999 | Meier et al. | |
| 5,889,593 A | 3/1999 | Bareket | |
| 5,932,377 A | 8/1999 | Ferguson et al. | |
| 5,940,458 A | 8/1999 | Suk | |
| 5,948,972 A | 9/1999 | Samsavar et al. | |
| 5,955,661 A | 9/1999 | Samsavar et al. | |
| 5,965,306 A | 10/1999 | Mansfield et al. | |
| 5,980,187 A | 11/1999 | Verhovsky | |
| 5,986,263 A | 11/1999 | Hiroi et al. | |
| 5,991,699 A | 11/1999 | Kulkarni et al. | |
| 6,011,404 A | 1/2000 | Ma et al. | |
| 6,014,461 A | 1/2000 | Hennessey et al. | |
| 6,052,478 A | 4/2000 | Wihl et al. | |
| 6,060,709 A | 5/2000 | Verkuil et al. | |
| 6,072,320 A | 6/2000 | Verkuil | |
| 6,076,465 A | 6/2000 | Vacca et al. | |
| 6,078,738 A | 6/2000 | Garza et al. | |
| 6,091,257 A | 7/2000 | Verkuil et al. | |
| 6,091,846 A | 7/2000 | Lin et al. | |
| 6,097,196 A | 8/2000 | Verkuil et al. | |
| 6,097,887 A | 8/2000 | Hardikar et al. | |
| 6,104,206 A | 8/2000 | Verkuil | |
| 6,104,835 A | 8/2000 | Han | |
| 6,121,783 A | 9/2000 | Horner et al. | |
| 6,122,017 A | 9/2000 | Taubman | |
| 6,122,046 A | 9/2000 | Almogy | |
| 6,137,570 A | 10/2000 | Chuang et al. | |
| 6,141,038 A | 10/2000 | Young et al. | |
| 6,146,627 A | 11/2000 | Muller | |
| 6,171,737 B1 | 1/2001 | Phan et al. | |
| 6,175,645 B1 | 1/2001 | Elyasaf et al. | |
| 6,184,929 B1 | 2/2001 | Noda et al. | |
| 6,184,976 B1 | 2/2001 | Park et al. | |
| 6,191,605 B1 | 2/2001 | Miller et al. | |
| 6,201,999 B1 | 3/2001 | Jevtic | |
| 6,202,029 B1 | 3/2001 | Verkuil et al. | |
| 6,205,239 B1 | 3/2001 | Lin et al. | |
| 6,224,638 B1 | 5/2001 | Jevtic et al. | |
| 6,233,719 B1 | 5/2001 | Hardikar et al. | |
| 6,248,485 B1 | 6/2001 | Cuthbert | |
| 6,248,486 B1 | 6/2001 | Dirksen et al. | |
| 6,259,960 B1 | 7/2001 | Inokuchi | |
| 6,266,437 B1 | 7/2001 | Elchel et al. | |
| 6,267,005 B1 | 7/2001 | Samsavar et al. | |
| 6,268,093 B1 | 7/2001 | Kenan et al. | |
| 6,272,236 B1 | 8/2001 | Pierrat et al. | |
| 6,282,309 B1 | 8/2001 | Emery | |
| 6,292,582 B1 | 9/2001 | Lin et al. | |
| 6,324,298 B1 | 11/2001 | O'Dell et al. | |
| 6,344,640 B1 | 2/2002 | Rhoads | |
| 6,363,166 B1 | 3/2002 | Wihl et al. | |
| 6,373,975 B1 | 4/2002 | Bula et al. | |
| 6,415,421 B2 | 7/2002 | Anderson et al. | |
| 6,445,199 B1 | 9/2002 | Satya et al. | |
| 6,451,690 B1 | 9/2002 | Matsumoto | |
| 6,466,314 B1 | 10/2002 | Lehman | |
| 6,466,315 B1 | 10/2002 | Karpol et al. | |
| 6,470,489 B1 | 10/2002 | Chang et al. | |
| 6,483,938 B1 | 11/2002 | Hennessey et al. | |
| 6,513,151 B1 | 1/2003 | Erhardt et al. | |
| 6,526,164 B1 | 2/2003 | Mansfield et al. | |
| 6,529,621 B1 | 3/2003 | Glasser et al. | |
| 6,535,628 B2 | 3/2003 | Smargiassi et al. | |
| 6,539,106 B1 | 3/2003 | Gallarda et al. | |
| 6,569,691 B1 | 5/2003 | Jastrzebski et al. | |
| 6,581,193 B1 | 6/2003 | McGhee et al. | |
| 6,593,748 B1 | 7/2003 | Halliyal et al. | |
| 6,597,193 B2 | 7/2003 | Lagowski et al. | |
| 6,602,728 B1 | 8/2003 | Liebmann et al. | |
| 6,608,681 B2 | 8/2003 | Tanaka et al. | |
| 6,614,520 B1 | 9/2003 | Baraket et al. | |
| 6,631,511 B2 | 10/2003 | Haffner | |
| 6,636,301 B1 | 10/2003 | Kvamme et al. | |
| 6,642,066 B1 | 11/2003 | Halliyal et al. | |
| 6,658,640 B2 | 12/2003 | Weed | |
| 6,665,065 B1 | 12/2003 | Phan et al. | |
| 6,670,082 B2 | 12/2003 | Liu et al. | |
| 6,680,621 B2 | 1/2004 | Savtchouk et al. | |
| 6,691,052 B1 | 2/2004 | Maurer | |
| 6,701,004 B1 | 3/2004 | Shykind et al. | |
| 6,718,526 B1 | 4/2004 | Eldredge et al. | |
| 6,721,695 B1 | 4/2004 | Chen et al. | |
| 6,734,696 B2 | 5/2004 | Horner et al. | |
| 6,748,103 B2 | 6/2004 | Glasser | |
| 6,751,519 B1 | 6/2004 | Satya et al. | |
| 6,753,954 B2 | 6/2004 | Chen | |
| 6,757,645 B2 | 6/2004 | Chang | |
| 6,759,655 B2 * | 7/2004 | Nara et al. ............ 850/9 | |
| 6,771,806 B1 | 8/2004 | Satya et al. | |
| 6,775,818 B2 | 8/2004 | Taravade et al. | |
| 6,777,147 B1 | 8/2004 | Fonseca et al. | |

| Patent/Pub No. | Date | Inventor |
|---|---|---|
| 6,777,676 B1 | 8/2004 | Wang et al. |
| 6,778,695 B1 | 8/2004 | Schellenberg et al. |
| 6,779,159 B2 | 8/2004 | Yokoyama et al. |
| 6,784,446 B1 | 8/2004 | Phan et al. |
| 6,788,400 B2 | 9/2004 | Chen |
| 6,789,032 B2 | 9/2004 | Barbour et al. |
| 6,803,554 B2 | 10/2004 | Ye et al. |
| 6,806,456 B1 | 10/2004 | Ye et al. |
| 6,807,503 B2 | 10/2004 | Ye et al. |
| 6,813,572 B2 | 11/2004 | Satya et al. |
| 6,820,028 B2 | 11/2004 | Ye et al. |
| 6,828,542 B2 | 12/2004 | Ye et al. |
| 6,842,225 B1 | 1/2005 | Irie |
| 6,859,746 B1 | 2/2005 | Stirton |
| 6,879,924 B2 | 4/2005 | Ye et al. |
| 6,882,745 B2 | 4/2005 | Brankner |
| 6,884,984 B2 | 4/2005 | Ye et al. |
| 6,886,153 B1 | 4/2005 | Bevis |
| 6,892,156 B2 | 5/2005 | Ye et al. |
| 6,902,855 B2 | 6/2005 | Peterson et al. |
| 6,906,305 B2 | 6/2005 | Pease et al. |
| 6,918,101 B1 | 7/2005 | Satya et al. |
| 6,948,141 B1 | 9/2005 | Satya et al. |
| 6,959,255 B2 | 10/2005 | Ye et al. |
| 6,966,047 B1 | 11/2005 | Glasser |
| 6,969,837 B2 | 11/2005 | Ye et al. |
| 6,969,864 B2 | 11/2005 | Ye et al. |
| 6,983,060 B1 | 1/2006 | Martinent-Catalot et al. |
| 6,988,045 B2 | 1/2006 | Purdy |
| 7,003,755 B2 | 2/2006 | Pang et al. |
| 7,003,758 B2 | 2/2006 | Ye et al. |
| 7,012,438 B1 | 3/2006 | Miller et al. |
| 7,026,615 B2 | 4/2006 | Takane et al. |
| 7,027,143 B1 * | 4/2006 | Stokowski et al. ....... 356/237.2 |
| 7,030,966 B2 | 4/2006 | Hansen |
| 7,030,997 B2 | 4/2006 | Neureuther et al. |
| 7,053,355 B2 | 5/2006 | Ye et al. |
| 7,061,625 B1 | 6/2006 | Hwang |
| 7,103,484 B1 | 9/2006 | Shi et al. |
| 7,106,895 B1 | 9/2006 | Goldberg et al. |
| 7,107,517 B1 | 9/2006 | Suzuki et al. |
| 7,107,571 B2 | 9/2006 | Chang et al. |
| 7,111,277 B2 | 9/2006 | Ye et al. |
| 7,114,145 B2 | 9/2006 | Ye et al. |
| 7,117,477 B2 | 10/2006 | Ye et al. |
| 7,117,478 B2 | 10/2006 | Ye et al. |
| 7,120,285 B1 | 10/2006 | Spence |
| 7,120,895 B2 | 10/2006 | Ye et al. |
| 7,123,356 B1 * | 10/2006 | Stokowski et al. ....... 356/237.2 |
| 7,124,386 B2 | 10/2006 | Smith |
| 7,133,548 B2 | 11/2006 | Kenan et al. |
| 7,135,344 B2 | 11/2006 | Nehmadi |
| 7,136,143 B2 | 11/2006 | Smith |
| 7,152,215 B2 | 12/2006 | Smith |
| 7,162,071 B2 * | 1/2007 | Hung et al. ................. 382/144 |
| 7,171,334 B2 | 1/2007 | Gassner |
| 7,174,520 B2 | 2/2007 | White |
| 7,194,709 B2 | 3/2007 | Brankner |
| 7,207,017 B1 | 4/2007 | Tabery et al. |
| 7,231,628 B2 | 6/2007 | Pack et al. |
| 7,236,847 B2 | 6/2007 | Marella |
| 7,379,175 B1 * | 5/2008 | Stokowski et al. ....... 356/237.5 |
| 7,386,839 B1 | 6/2008 | Golender et al. |
| 7,418,124 B2 | 8/2008 | Peterson et al. |
| 7,424,145 B2 | 9/2008 | Horie et al. |
| 2001/0019625 A1 | 9/2001 | Kenan et al. |
| 2001/0022858 A1 | 9/2001 | Komiya et al. |
| 2001/0043735 A1 | 11/2001 | Smargiassi et al. |
| 2002/0019729 A1 | 2/2002 | Chang et al. |
| 2002/0026626 A1 | 2/2002 | Randall et al. |
| 2002/0033449 A1 | 3/2002 | Nakasuji et al. |
| 2002/0035461 A1 | 3/2002 | Chang et al. |
| 2002/0035641 A1 | 3/2002 | Kurose |
| 2002/0088951 A1 | 7/2002 | Chen |
| 2002/0090746 A1 | 7/2002 | Xu et al. |
| 2002/0134936 A1 | 9/2002 | Matsui et al. |
| 2002/0144230 A1 | 10/2002 | Rittman |
| 2002/0164065 A1 | 11/2002 | Cai et al. |
| 2002/0181756 A1 | 12/2002 | Shibuya et al. |
| 2002/0186878 A1 | 12/2002 | Hoon et al. |
| 2002/0192578 A1 | 12/2002 | Tanaka et al. |
| 2003/0014146 A1 | 1/2003 | Fujii |
| 2003/0022401 A1 | 1/2003 | Hamamatsu et al. |
| 2003/0033046 A1 | 2/2003 | Yoshitake et al. |
| 2003/0048458 A1 | 3/2003 | Mieher |
| 2003/0048939 A1 | 3/2003 | Lehman |
| 2003/0057971 A1 | 3/2003 | Nishiyama et al. |
| 2003/0086081 A1 | 5/2003 | Lehman |
| 2003/0098805 A1 | 5/2003 | Bizjak |
| 2003/0128870 A1 | 7/2003 | Pease et al. |
| 2003/0138138 A1 | 7/2003 | Vacca et al. |
| 2003/0138978 A1 | 7/2003 | Tanaka et al. |
| 2003/0169916 A1 | 9/2003 | Hayashi et al. |
| 2003/0207475 A1 | 11/2003 | Nakasuji et al. |
| 2003/0223639 A1 | 12/2003 | Shlain et al. |
| 2003/0226951 A1 | 12/2003 | Ye et al. |
| 2003/0228714 A1 | 12/2003 | Smith |
| 2003/0229410 A1 | 12/2003 | Smith |
| 2003/0229412 A1 | 12/2003 | White |
| 2003/0229868 A1 | 12/2003 | White |
| 2003/0229875 A1 | 12/2003 | Smith |
| 2003/0229880 A1 | 12/2003 | White |
| 2003/0229881 A1 | 12/2003 | White |
| 2003/0237064 A1 | 12/2003 | White et al. |
| 2004/0030430 A1 | 2/2004 | Matsuoka |
| 2004/0032908 A1 | 2/2004 | Hagai et al. |
| 2004/0052411 A1 | 3/2004 | Qian et al. |
| 2004/0057611 A1 | 3/2004 | Lee et al. |
| 2004/0091142 A1 | 5/2004 | Peterson et al. |
| 2004/0098216 A1 | 5/2004 | Ye et al. |
| 2004/0102934 A1 | 5/2004 | Chang |
| 2004/0107412 A1 | 6/2004 | Pack et al. |
| 2004/0119036 A1 | 6/2004 | Ye et al. |
| 2004/0120569 A1 * | 6/2004 | Hung et al. ................. 382/144 |
| 2004/0133369 A1 | 7/2004 | Pack et al. |
| 2004/0174506 A1 | 9/2004 | Smith |
| 2004/0223639 A1 | 11/2004 | Sato et al. |
| 2004/0228515 A1 | 11/2004 | Okabe et al. |
| 2004/0243320 A1 | 12/2004 | Chang et al. |
| 2005/0004774 A1 | 1/2005 | Volk et al. |
| 2005/0008218 A1 | 1/2005 | O'Dell et al. |
| 2005/0010890 A1 | 1/2005 | Nehmadi et al. |
| 2005/0062962 A1 | 3/2005 | Fairley |
| 2005/0117796 A1 | 6/2005 | Matsui et al. |
| 2005/0132306 A1 | 6/2005 | Smith |
| 2005/0166174 A1 | 7/2005 | Ye et al. |
| 2005/0190957 A1 | 9/2005 | Cai et al. |
| 2005/0198602 A1 | 9/2005 | Brankner |
| 2006/0000964 A1 | 1/2006 | Ye et al. |
| 2006/0048089 A1 | 3/2006 | Schwarzbaned |
| 2006/0051682 A1 | 3/2006 | Hess et al. |
| 2006/0062445 A1 | 3/2006 | Verma et al. |
| 2006/0082763 A1 | 4/2006 | The et al. |
| 2006/0159333 A1 | 7/2006 | Ishikawa |
| 2006/0161452 A1 | 7/2006 | Hess et al. |
| 2006/0193506 A1 | 8/2006 | Dorphan et al. |
| 2006/0193507 A1 | 8/2006 | Sali et al. |
| 2006/0236294 A1 | 10/2006 | Saidin |
| 2006/0236297 A1 | 10/2006 | Melvin et al. |
| 2006/0265145 A1 | 11/2006 | Huet et al. |
| 2006/0269120 A1 | 11/2006 | Nehmadi et al. |
| 2006/0273242 A1 | 12/2006 | Hunsche et al. |
| 2006/0273266 A1 | 12/2006 | Preil et al. |
| 2006/0291714 A1 | 12/2006 | Wu et al. |
| 2006/0292463 A1 | 12/2006 | Best et al. |
| 2007/0002322 A1 | 1/2007 | Borodovsky et al. |

| 2007/0019171 | A1 | 1/2007 | Smith |
| 2007/0031745 | A1 | 2/2007 | Ye et al. |
| 2007/0032896 | A1 | 2/2007 | Ye et al. |
| 2007/0035712 | A1 | 2/2007 | Gassner et al. |
| 2007/0035728 | A1 | 2/2007 | Kekare et al. |
| 2007/0052963 | A1 | 3/2007 | Orbon |
| 2007/0064995 | A1 | 3/2007 | Oaki et al. |
| 2007/0133860 | A1 | 6/2007 | Lin |
| 2007/0156379 | A1 | 7/2007 | Kulkarni et al. |
| 2007/0230770 | A1 | 10/2007 | Kulkarni et al. |
| 2007/0288219 | A1 | 12/2007 | Zafar et al. |
| 2008/0013083 | A1 | 1/2008 | Kirk et al. |
| 2008/0049994 | A1 | 2/2008 | Rognin et al. |
| 2008/0163140 | A1 | 7/2008 | Fouquet et al. |
| 2008/0167829 | A1 | 7/2008 | Park et al. |

FOREIGN PATENT DOCUMENTS

| EP | 0370322 | 5/1990 |
| EP | 1061358 | 12/2000 |
| EP | 1061571 | 12/2000 |
| EP | 1065567 | 1/2001 |
| EP | 1066925 | 1/2001 |
| EP | 1069609 | 1/2001 |
| EP | 1093017 | 4/2001 |
| EP | 1480034 | 11/2004 |
| EP | 1696270 | 8/2006 |
| JP | 2002-071575 | 3/2002 |
| KR | 1020030055848 | 7/2003 |
| WO | WO 98/57358 | 12/1998 |
| WO | WO 99/22310 | 5/1999 |
| WO | WO 99/25004 | 5/1999 |
| WO | WO 99/38002 | 7/1999 |
| WO | WO 99/41434 | 8/1999 |
| WO | WO 99/59200 | 11/1999 |
| WO | WO 00/03234 | 1/2000 |
| WO | WO 00/36525 | 6/2000 |
| WO | WO 00/55799 | 9/2000 |
| WO | WO 00/68884 | 11/2000 |
| WO | WO 00/70332 | 11/2000 |
| WO | WO 01/09566 | 2/2001 |
| WO | WO 01/40145 | 6/2001 |
| WO | WO 03/104921 | 12/2003 |
| WO | WO 2004/027684 | 4/2004 |
| WO | WO 2006/063268 | 6/2006 |

OTHER PUBLICATIONS

Barty et al., "Aerial Image Microscopes for the inspection of defects in EUV masks," Proceedings of SPIE, vol. 4889, 2002, pp. 1073-1084.

Budd et al., "A New Mask Evaluation Tool, the Microlithography Simulation Microscope Aerial Image Measurement System," SPIE vol. 2197, 1994, pp. 530-540.

Cai et al., "Enhanced Dispositioning of Reticle Defects Using the Virtual Stepper With Automoated Defect Severity Scoring," Proceedings of the SPIE, vol. 4409, Jan. 2001, pp. 467-478.

Comizzoli, "Uses of Corono Discharges in the Semiconfuctor Industry," J. Electrochem. Soc., 1987, pp. 424-429.

Contactless Electrical Equivalent Oxide Thickness Measurement, IBM Technical Disclosure Bulletin, vol. 29, No. 10, 1987, pp. 4622-4623.

Contactless Photovoltage vs. Bias Method for Determining Flat-Band Voltage, IBM Technical Disclosure Bulletin, vol. 32, vol. 9A, 1990, pp. 14-17.

Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.

Diebold et al., "Characterization and produiction metrology of thin transistor gate oxide films," Materials Science in Semiconductor Processing 2, 1999, pp. 103-147.

Dirksen et al., "Impact of high order aberrations on the performance of the aberration monitor," Proc. Of SPIE vol. 4000, Mar. 2000, pp. 9-17.

Dirksen et al., "Novel aberration monitor for optical lithography," Proc. Of SPIE vol. 3679, Jul. 1999, pp. 77-86.

Garcia et al., "New Die to Database Inspection Algorithm for Inspection of 90-nm Node Reticles," Proceedings of SPIE, vol. 5130, 2003, pp. 364-374.

Granik et al., "Sub-resolution process windows and yield estimation technique based on detailed full-chip CD simulation," Mentor Graphics, Sep. 2000, 5 pages.

Hess et al., "A Novel Approach: High Resolution Inspection with Wafer Plane Defect Detection," Proceedings of SPIE—International Society for Optical Engineering; Photomask and Next-Generation Lithography Mask Technology 2008, vol. 7028, 2008.

Huang et al., "Process Window Impact of Progressive Mask Defects, Its Inspection and Disposition Techniques (go/no-go criteria) Via a Lithographic Detector," Proceedings of SPIE—The International Society for Optical Engineering; 25th Annual Bacus Symposium on Photomask Technology 2005, vol. 5992.

Hung et al., Metrology Study of Sub 20 Angstrom oxynitride by Corona-Oxide-Silicon (COS) and Conventional C-V Approaches, 2002, Mat. Res. Soc. Symp. Proc., vol. 716, pp. 119-124.

International Search Report for PCT/US2003/21907 mailed Jun. 7, 2004.

International Search Report for PCT/US2004/040733 mailed Dec. 23, 2005.

International Search Report and Written Opinion for PCT Appln. No. PCT/US08/050397 dated Jul. 11, 2008.

International Search Report and Written Opinion for PCT Appln. No. PCT/US06/61113 dated Jul. 16, 2008.

International Search Report and Written Opinion for PCT/US2008/062873 mailed Aug. 12, 2008.

International Search Report and Written Opinion for PCT Appln. No. PCT/US2008/063008 dated Aug. 18, 2008.

International Search Report for PCT/US2008/62875 mailed Sep. 10, 2008.

International Search Report and Written Opinion for PCT Appln. No. PCT/US06/61112 dated Sep. 25, 2008.

International Search Report for PCT/US2008/70647 mailed Dec. 16, 2008.

Karklin et al., "Automatic Defect Severity Scoring for 193 nm Reticle Defect Inspection," Proceedings of SPIE—The International Society for Optical Engineering, 2001, vol. 4346, No. 2, pp. 898-906.

Lo et al., "Identifying Process Window Marginalities of Reticle Designs for 0.15/0.13 μm Technologies," Proceedings of SPIE vol. 5130, 2003, pp. 829-837.

Lorusso et al. "Advanced DFM Applns. Using design-based metrology on CDSEM," SPIE vol. 6152, Mar. 27, 2006.

Lu et al., "Application of Simulation Based Defect Printability Analysis for Mask Qualification Control," Proceedings of SPIE, vol. 5038, 2003, pp. 33-40.

Mack, "Lithographic Simulation: A Review," Proceedings of SPIE vol. 4440, 2001, pp. 59-72.

Martino et al., "Application of the Aerial Image Measurement System (AIMS(TM)) to the Analysis of Binary Mask Imaging and Resolution Enhancement Techniques," SPIE vol. 2197, 1994, pp. 573-584.

Miller, "A New Approach for Measuring Oxide Thickness," Semiconductor International, Jul. 1995, pp. 147-148.

Nagpal et al., "Wafer Plane Inspection for Advanced Reticle Defects," Proceedings of SPIE—The International Society for Optical Engineering; Photomask and Next-Generation Lithography Mask Technology. vol. 7028, 2008.

Numerical Recipes in C. The Art of Scientific Computing, 2nd Ed., © Cambridge University Press 1988, 1992, p. 683.

Otsu, "A Threshold Selection Method from Gray-Level Histograms," IEEE Transactions on Systems, Man, and Cybernetics, vol. SMC-9, No. 1, Jan. 1979, pp. 62-66.

Pang et al., "Simulation-based Defect Printability Analysis on Alternating Phase Shifting Masks for 193 nm Lithography," Proceedings of SPIE, vol. 4889, 2002, pp. 947-954.

Pettibone et al., "Wafer Printability Simulation Accuracy Based on UV Optical Inspection Images of Reticle Defects," Proceedings of SPIE—The International Society for Optical Engineering 1999 Society of Photo-Optical Instrumentation Engineers, vol. 3677, No. II, 1999, pp. 711-720.

Phan et al., "Comparison of Binary Mask Defect Printability Analysis Using Virtual Stepper System and Aerial Image Microscope System," Proceedings of SPIE—The International Society for Optical Engineering 1999 Society of Photo-Optical Instrumentation Engineers, vol. 3873, 1999, pp. 681-692.

Sahouria et al., "Full-chip Process Simulation for Silicon DRC," Mentor Graphics, Mar. 2000, 6 pages.

Schroder et al., Corono-Oxide-Semiconductor Device Characterization, 1998, Solid-State Electronics, vol. 42, No. 4, pp. 505-512.

Schroder, "Surface voltage and surface photovoltage: history, theory and applications," Measurement Science and Technology, vol. 12, 2001, pp. R16-31.

Schroder, Contactless Surface Charge Semiconductor Characterization, Apr. 2002, Materials Science and Engineering B, vol. 91-92, pp. 196-228.

Schurz et al., "Simulation Study of Reticle Enhancement Technology Applications for 157 nm Lithography," SPIE vol. 4562, 2002, pp. 902-913.

Svidenko et al. "Dynamic Defect-Limited Yield Prediction by Criticality Factor," ISSM Paper: YE-O-157, 2007.

U.S. Appl. No. 10/677,445 (Horner et al.) entitled Methods for Non-Contacting Differential Voltage Measurements filed on Oct. 2, 2003.

U.S. Appl. No. 10/778,752 (Mack et al.) entitled Methods for Improved Monitor and Control of Lithography Processes filed on Feb. 13, 2004.

U.S. Appl. No. 11/154,310 (Verma et al.) entitled Computer-Implemented Methods, Simulation Engines and Systems for filed on Jun. 16, 2005.

U.S. Appl. No. 11/830,485 (Kulkarni et al.) entitled Semiconductor Device Property Extraction, Generation, Visualization, and Monitoring Methods filed on Jul. 30, 2007.

U.S. Appl. No. 11/837,208 (Park at al.) entitled Computer-Implemented Methods, Carrier Media, and Systems for Generating a Metrology Sampling Plan filed on Aug. 10, 2007.

U.S. Appl. No. 11/960,157 (Duffy et al.) entitled Systems and Methodsfor Creating Inspection Recipes filed on Dec. 19, 2007.

U.S. Appl. No. 12/102,343 (Chen et al.) entitled Methods and Systems for Determining a Defect Criticality Index for Defects on Wafers filed on Apr. 14, 2008.

U.S. Appl. No. 12/115,830 (Su et al.) entitled Computer-Implemented Methods, Systems, and Computer-Readable Media for Determining a Model for Predicting Printability of Reticle Features on a Wafer filed on May 6, 2008.

U.S. Appl. No. 12/116,664 (Peterson et al.) entitled Methods and Systems for Detecting Defects in a Reticle Design Pattern filed on May 7, 2008.

U.S. Appl. No. 12/195,024 (Florence et al.) entitled Computer-Implemented Methods for Determining if Actual Defects are Potentially Systematic Defects or Potentially Random Defects filed on Aug. 20, 2008.

U.S. Appl. No. 12/176,095 (Bhaskar et al.) entitled Methods for Generating a Standard Reference Die for Use in a Die to Standard Reference Die Inspection and Methods for Inspecting a Wafer filed on Jul. 18, 2008.

U.S. Appl. No. 60/418,887 (Su et al.) entitled Methods and Systems for Inspecting Reticles Using Aerial Imaging and Die-To-Database Detection filed on Oct. 15, 2002.

U.S. Appl. No. 60/418,994 (Stokowski et al.) entitled Methods and Systems for Reticle Inspection and Defect Review Using Aerial Imaging filed on Oct. 15, 2002.

U.S. Appl. No. 60/419,028 (Stokowski et al.) entitled Methods and Systems for Inspecting Reticles Using Aerial Imaging at Off-Stepper Wavelengths filed on Oct. 15, 2002.

U.S. Appl. No. 60/451,707 (Howard et al.) entitled Methods and Systems for Classifying and Analyzing Defects on Reticles filed on Mar. 4, 2003.

U.S. Appl. No. 60/526,881 (Hess et al.) entitled Designer Intent filed on Dec. 4, 2003.

U.S. Appl. No. 60/609,670 (Preil et al.) entitled Methods, Systems, and Carrier Media for Evaluating Reticle Layout Data filed on Sep. 14, 2004.

U.S. Appl. No. 60/681,095 (Nehmadi et al.) entitled Methods in Mask and Process Qualification filed on May 13, 2005.

U.S. Appl. No. 60/684,360 (Nehmadi et al.) entitled Design-Based Inspection filed on May 24, 2005.

U.S. Appl. No. 60/738,290 (Kulkarni et al.) entitled Methods and Systems for Utilizing Design Data in Combination With Inspection Data filed on Nov. 18, 2005.

U.S. Appl. No. 60/772,418 (Kirk et al.) entitled Methods and Systems for Determining a Characteristic of a Wafer filed on Feb. 9, 2006.

Verkuil et al., "A Contactless Alternative to MOS Charge Measurements by Means of a Corona-Oxide-Semiconductor (COS) Technique, "Electrochem. Soc. Extended Abstracts, 1988, vol. 88-1, No. 169, pp. 261-262.

Verkuil, "Rapid Contactless Method for Measuring Fixed Oxide Charge ASsociated with SIlicon Processing," IBM Technical Disclousre Bulletin, vol. 24, No. 6, 1981, pp. 3048-3053.

Volk et al, "Investigation of Reticle Defect Formation at DUV Lithography," 2002, BACUS Symposium on Photomask Technology.

Volk et al. "Investigation of Reticle Defect Formation at DUV Lithography," 2003, IEEE/SEMI Advanced Manufacturing Conference, pp. 29-35.

Volk et al., "Investigation of Smart Inspection of Critical Layer Reticles using Additional Designer Data to Determine Defect Significance," Proceeings of SPIE vol. 5256, 2003, pp. 489-499.

Weinberg, "Tunneling of Electrons from Si into Thermally Grown Si02," Solid-State Electronics, 1977, vol. 20, pp. 11-18.

Weinzierl et al., "Non-Contact Corona-Based Process Control Measurements: Where We've Been, Where We're Headed," Electrochemical Society Proceedings, Oct. 1999, vol. 99-16, pp. 342-350.

Yan et al., "Printability of Pellicle Defects in DUV 0.5 um Lithography," SPIE vol. 1604, 1991, pp. 106-117.

International Search Report and Written Opinion for PCT/US2008/073706 mailed Jan. 29, 2009.

International Search Report and Written Opinion for PCT/US2008/072636 mailed Jan. 29, 2009.

International Search Report & Written Opinion, PCT/US2008/066328, mailed Oct. 1, 2009.

O'Gorman et al., "Subpixel Registration Using a Concentric Ring Fiducial," Proceedings of the International Conference on Pattern Recognition, vol. ii, Jun. 16, 1990, pp. 249-253.

* cited by examiner

METHODS FOR DETECTING AND CLASSIFYING DEFECTS ON A RETICLE

PRIORITY CLAIM

This application claims priority to U.S. Provisional Application No. 60/916,356 entitled "Methods for Detecting and Classifying Defects on a Reticle," filed May 7, 2007, which is incorporated by reference as if fully set forth herein.

BACKGROUND OF THE INVENTION

1. Field of the Invention

This invention relates to methods for detecting and classifying defects on a reticle. Certain embodiments relate to methods that include acquiring images of the reticle at different conditions during inspection of the reticle, detecting defects on the reticle using images acquired at one of the conditions, and classifying the defects on the reticle using images acquired at another of the conditions.

2. Description of the Related Art

The following descriptions and examples are not admitted to be prior art by virtue of their inclusion within this section.

An integrated circuit (IC) design may be developed using methods and systems such as electronic design automation (EDA), computer aided design (CAD), and other IC design software. Such methods and systems may also be used to generate a circuit pattern database from the IC design. A circuit pattern database includes data representing a plurality of layouts for various layers of the IC. Data in the circuit pattern database may be used to determine layouts for a plurality of reticles. The terms "reticle" and "mask" are used interchangeably herein.

A layout of a reticle generally includes a plurality of polygons that define features in a pattern on the reticle. Typically, these polygons can be generally defined by their size and placement on the reticle. Different reticles are used to fabricate different layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

Reticles are used to pattern a resist in a lithography process step, then the to patterned resist is used to form features of the IC on the wafer. Therefore, the patterned features that are formed on a reticle and are to be transferred to the wafer reflect the characteristics of the features that are included in the IC design. For example, the features that are formed on the reticle may be based on and are used to form individual components of the ICs such as those described above.

The complexity of the IC design, therefore, has a direct impact on the manufacture and inspection of reticles. In particular, as the complexity of the IC design increases, successful reticle manufacture becomes more difficult. For instance, as the dimensions of the IC features and the spacings between the features decrease, the dimensions and spacings of features on the reticle also decrease. In this manner, it becomes more difficult to form these features on a reticle due to, for example, limitations of the reticle manufacturing process. In a similar manner, it becomes more difficult to inspect these features due to limitations of the reticle inspection processes. Furthermore, as is known in the art, the difficulty of successfully reproducing these features on wafers increases as the dimensions and spacings decrease.

In addition, as the dimensions of IC features approach the wavelength of the energy source used to print the reticle pattern on wafers, reticle enhancement techniques (RET) such as optical proximity correction (OPC) features are increasingly relied upon to improve transfer of the reticle features to the wafer. In particular, RET features cause the pattern printed on wafers to differ significantly from the pattern physically formed on a reticle. Additional examples of reticle enhancing techniques include, but are not limited to, phase shifting regions, polarization reticles, multiple exposures, off-axis illumination, illumination shapes, and dipole illumination.

OPC features generally take the form of sub-resolution assist features (SRAF) that are formed on the reticle but which do not print on the wafer. Instead, OPC features are designed to increase or decrease the amount of light incident on the wafer proximate certain portions of the features such as corners. OPC features further complicate the design, manufacture, and inspection of reticles. However, due to the assistance that these features provide for printing features with acceptable characteristics, almost all reticles today include OPC features or another type of RET features. Furthermore, optical effects such as mask error enhancement factor (MEEF) may cause additional distortion of the final image at the wafer level. MEEF may be generally defined as the ratio of the critical dimension (CD) of a feature printed in a resist to the CD of a structure formed on a reticle.

Despite the increasing difficulty of reticle inspection, due to the important role that reticles play in semiconductor fabrication, ensuring that the reticles have been manufactured satisfactorily (such that the reticles can be used to produce the desired images on wafers) is critical to successful semiconductor fabrication. In general, during a reticle inspection process, an optical image of the reticle is typically compared to a baseline image. The baseline image is either generated from the circuit pattern data or from an adjacent die on the reticle itself. Either way, the optical image features are analyzed and compared with corresponding features of the baseline image. Each feature difference is then compared against a single threshold value. If the optical image feature varies from the baseline feature by more than the predetermined threshold, a defect may be defined.

In order for inspection to provide useful results, the inspection process is preferably able to not only detect many different kinds of defects but also to discriminate between real defects on the reticle and noise or nuisance events. Noise may be defined as events detected on a reticle by an inspection tool that are not actually defects but appear as potential defects due to marginalities in the inspection tool such as marginalities in data processing and/or data acquisition. Nuisance events are actual defects but are not relevant to the user for the purposes of controlling the process or predicting yield. Moreover, the same defect may be considered a nuisance event at one point in time, but it may later be found to be a relevant defect. In some instances, the number of noise and nuisance events detected by an inspection tool can be reduced by using optimized data acquisition parameters and optimized data processing parameters. In addition, the number of noise and nuisance events can be reduced by applying various filtering techniques to the inspection results. Therefore, one challenge of reticle inspection is to differentiate between real defects and noise or nuisance events such that the results accurately reflect the actual defects without being overwhelmed by noise and nuisance events.

Furthermore, as the dimensions of ICs decrease and the patterns being transferred from the reticle to the wafer become more complex, defects in the features formed on the reticle become increasingly important. In particular, if the pattern is not formed accurately on the reticle, such discrepancies increasingly produce defects on the wafer as the dimensions of the pattern decrease and the complexity of the pattern increases. Therefore, significant efforts have been devoted to developing methods and systems that can be used to detect problems in the pattern on the reticle that will cause problems on the wafer. These efforts are relatively complex and difficult due, at least in part, to the fact that not all discrepancies in the pattern formed on the reticle (as compared to the ideal pattern) will cause errors on the wafer that will adversely affect the IC. In other words, an error in the pattern formed on the reticle may not produce defects on the wafer at all or may produce defects on the wafer that will not reduce the performance characteristics of the IC. Therefore, one challenge of many in developing adequate methods and systems for inspecting a reticle is to discriminate between pattern defects that "matter" and those that do not.

Accordingly, it would be advantageous to develop methods for detecting and classifying defects on a reticle, which do not have one or more of the disadvantages described above.

SUMMARY OF THE INVENTION

The following description of various method embodiments is not to be construed in any way as limiting the subject matter of the appended claims.

One embodiment relates to a method for detecting and classifying defects on a reticle. The method includes acquiring images of the reticle at first and second conditions during inspection of the reticle. The first condition is different than the second condition. The method also includes detecting the defects on the reticle using one or more of the images acquired at the first condition. In addition, the method includes classifying an importance of the defects detected on the reticle using one or more of the images acquired at the second condition. The detecting and classifying steps are performed substantially simultaneously during the inspection.

In one embodiment, the first and second conditions include different resolutions. In another embodiment, the first condition includes high resolution, and the second condition includes low resolution, In an additional embodiment, the first condition includes low resolution, and the second condition includes high resolution. In a further embodiment, one of the first and second conditions includes high resolution, and another of the first and second conditions simulates an image of the reticle that will be printed on a wafer.

In one embodiment, one of the first and second conditions includes low resolution. In one such embodiment, the acquiring step includes acquiring one or more of the images at the low resolution using an optical subsystem that simulates printing of the reticle on a wafer. In another such embodiment, the acquiring step includes acquiring one or more of the images at the low resolution by using multiple images acquired under different optical conditions to form a single simulated scanner resist image. In an additional such embodiment, the acquiring step includes acquiring one or more of the images at the low resolution by manipulating one or more images acquired by an optical subsystem configured to simulate projection of the reticle on a wafer to generate one or more images illustrating how the reticle will print in a resist formed on the wafer. In a further such embodiment, the acquiring step includes acquiring one or more of the images at the low resolution by manipulating an image acquired by an optical subsystem to simulate printing of the reticle in a resist formed on a wafer at different exposure conditions.

In some embodiments, the first condition includes low resolution, and the second condition includes high resolution. In one such embodiment, the acquiring step includes acquiring one or more of the images at the low resolution by using multiple images acquired under different optical conditions to form a single simulated scanner resist image. In another embodiment, one of the first and second conditions includes low resolution, and the acquiring step includes generating one or more of the images at the low resolution by simulating processes for manufacturing the reticle, projecting the reticle onto a wafer, and developing a resist on the wafer. In an additional embodiment, the first condition includes low resolution, the second condition includes high resolution, and the defects include slowly-varying phase defects.

In one embodiment, the detecting step includes detecting the defects on the reticle using two or more of the images acquired at the first and second conditions. In another embodiment, the second condition includes low resolution, and one or more of the images acquired at the low resolution simulate printing of the reticle on a wafer at different exposure conditions. In one such embodiment, the classifying step includes determining printability of the defects at the different exposure conditions using the one or more images acquired at the low resolution and determining the importance based on the printability of the defects at the different exposure conditions.

In one embodiment, the classifying step includes determining a pattern error that will be produced by the defects when the reticle is printed on a wafer. In another embodiment, the classifying step includes determining the importance of the defects based on sizes of the defects, mask error enhancement factors of areas of the reticle in which the defects are located, and effects of the defects on printing of the reticle on a wafer. In some embodiments, the method includes generating a list of the defects detected on the reticle and removing defects classified as having low importance from the list.

Each of the steps of each of the method embodiments described above may be performed as described further herein. Each of the embodiments of the method described above may include any other step(s) described herein. The embodiments of the method described above may be performed by any of the systems described herein.

Another embodiment relates to a different method for detecting and classifying defects on a reticle. This method includes acquiring images of the reticle at low and high resolutions during inspection of the reticle. The method also includes detecting the defects on the reticle using one or more of the images acquired at the high resolution. In addition, the method includes classifying an importance of the defects detected on the reticle using one or more of the images acquired at the low resolution.

In one embodiment, the detecting and classifying steps are performed substantially simultaneously during the inspection. In another embodiment, the one or more images acquired at the low resolution simulate printing of the reticle on a wafer. In an additional embodiment, the one or more images acquired at the low resolution illustrate how the reticle will be printed on a wafer at different exposure conditions. In one such embodiment, the classifying step includes determining printability of the defects at the different exposure conditions using the one or more images acquired at the low resolution and determining the importance based on the printability of the defects at the different exposure conditions.

Each of the steps of each of the method embodiments described above may be performed as described further herein. Each of the embodiments of the method described above may include any other step(s) described herein. The embodiments of the method described above may be performed by any of the systems described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
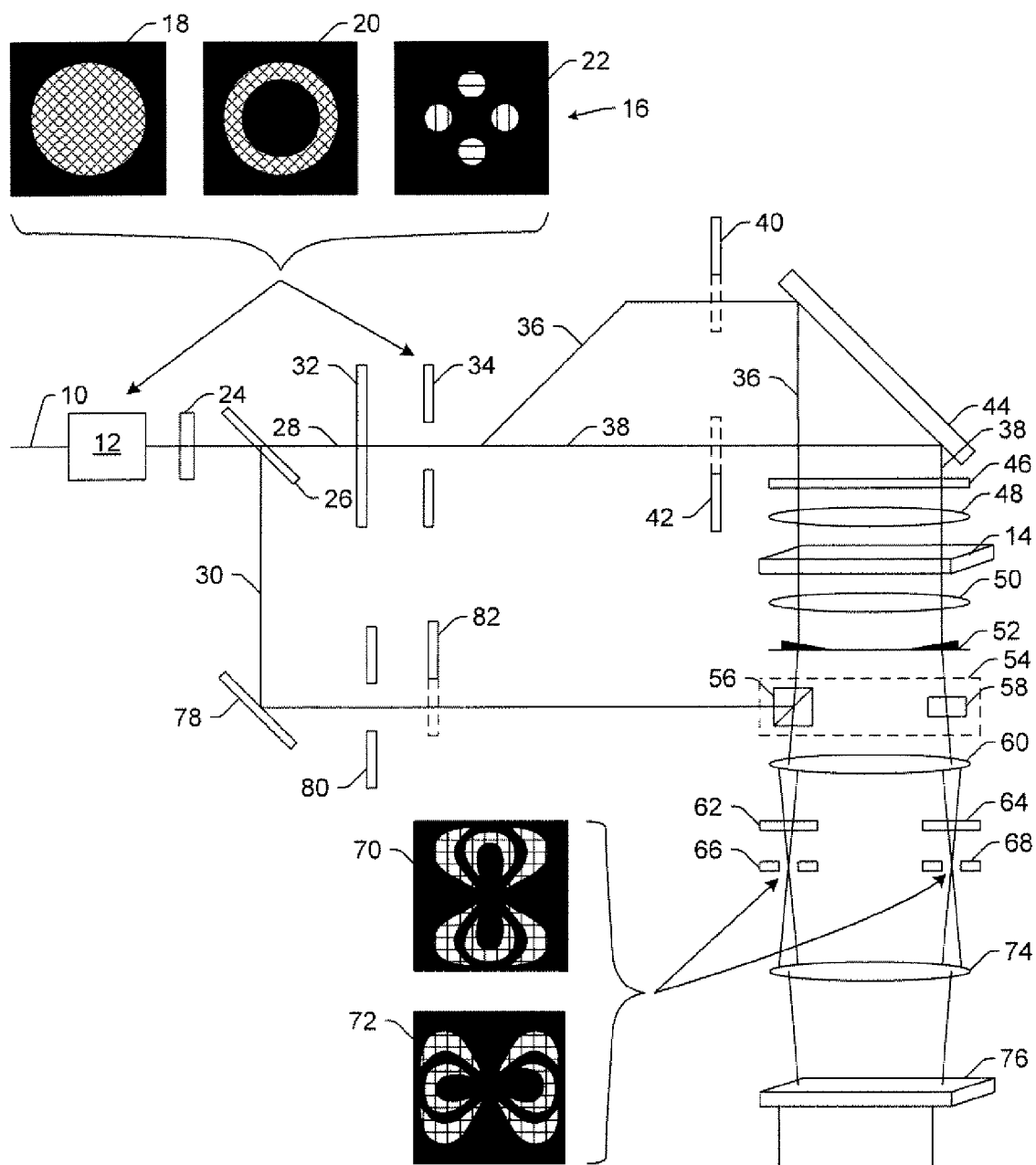
FIG. 1 is a schematic diagram illustrating a side view of one embodiment of a system configured to detect and classify defects on a reticle.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "reticle" and "mask" are used interchangeably herein. A reticle generally includes a transparent substrate such as glass, borosilicate glass, and fused silica having patterned regions of opaque material formed thereon. The opaque regions may be replaced by regions etched into the transparent substrate. Many different types of reticles are known in the art, and the term reticle as used herein is intended to encompass all types of reticles.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities. One or more layers may be formed upon a wafer. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed.

One or more layers formed on a wafer may be patterned or unpatterned. For example, a wafer may include a plurality of dies, each having repeatable patterned features. Formation and processing of such layers of material may ultimately result in completed semiconductor devices. As such, a wafer may include a substrate on which not all layers of a complete semiconductor device have been formed or a substrate on which all layers of a complete semiconductor device have been formed.

The wafer may further include at least a portion of an integrated circuit (IC), a thin-film head die, a micro-electro-mechanical system (MEMS) device, flat panel displays, magnetic heads, magnetic and optical storage media, other components that may include photonics and optoelectronic devices such as lasers, waveguides and other passive components processed on wafers, print heads, and bio-chip devices processed on wafers.

The terms "first" and "second" are used herein to differentiate between different conditions, etc. The terms "first" and "second" are not used to indicate temporal, spatial, or preferential characteristics of the conditions, etc.

As used herein, the term "high resolution" is generally defined as a resolution that allows all structures formed on the reticle to be imaged as printed on the reticle. In contrast, as used herein, the term "low resolution" is generally defined as a resolution that does not allow all structures formed on the reticle to be imaged as printed on the reticle. For example, "high resolution" conditions may include a resolution that allows reticle enhancement technique (ET) features such as optical proximity correction (OPC) features printed on the reticle to be resolved in images of the reticle. In this example, "low resolution" conditions may include a resolution that does not allow RET features such as OPC features printed on the reticle to be resolved in images of the reticle. Therefore, "high resolution" conditions as defined herein generally include conditions that allow an image that is substantially representative of the fabricated reticle to be produced. In addition, "low resolution" conditions as defined herein generally include conditions that do not allow an image that is substantially representative of the fabricated reticle to be produced. Instead, the "low resolution" conditions may include conditions that allow an image to be produced that is at least roughly equivalent to an image of the reticle that would be projected onto a wafer by an exposure system.

The specific conditions that will determine if an image of a reticle is acquired at low or high resolution will vary depending on, for example, the system used to generate the image of the reticle and one or more characteristics of the reticle. For example, resolution of an optical subsystem generally increases with numerical aperture (NA). Therefore, high resolution conditions may generally correspond to high NA conditions, and low resolution conditions may generally correspond to low NA conditions. However, the exact NA values that correspond to high and low resolutions will vary depending on other parameters of the optical subsystem and the reticle.

Reticle inspection systems detect many relatively small defects on reticles that do not result in pattern errors on wafers because the defects are either too small or the defects occur in a low mask error enhancement factor (MEEF) region of the pattern. Such defects are commonly referred to as "nuisance defects." To minimize the number of these nuisance defects in reticle inspection results, users sometimes reduce the defect sensitivity threshold on reticle inspection systems, which increases the risk of missing small but important defects.

Some current methods for reticle inspection include inspecting a reticle with transmitted light, reflected light, or a combination of both reflected and transmitted light using die-to-die, die-to-database, and/or Starlight inspection methods. Defect detection identifies pattern defects by comparing "test" and "reference" patterns according to a series of rules and user established thresholds. After the whole inspection area has been scanned and defects detected, the user reviews the defects by looking at captured images of the test and reference images and a difference image (e.g., an image of the test image minus the reference image). The goal of this review is for the user to classify the defects as unimportant, important but repairable, or important but impossible to repair (meaning the reticle must be remade). In addition to the images captured during the inspection, the user may return to the defect locations and capture additional images of the defects using a camera with a resolution higher than that used during the inspection. This "live" image can be manipulated by the user by changing contrast, brightness, illumination source (reflected or transmitted), focus offset, or some combination thereof. These post-inspection review processes are viewed by users as vital to proper classification of some defects.

However, the above-described methods have a number of disadvantages. For example, the methods described above are substantially slow, which forces the user to reduce the inspection system defect detection thresholds. In particular, defect-by-defect review is so slow that if the reticle has more than about 100 defects, the user may decide to reduce the defect detection threshold and re-inspect the mask to make the number of defects to be reviewed manageable. In addition, the above-described methods are disadvantageous because proper defect dispositioning is operator dependent.

In general, the embodiments described herein provide methods to improve classification of defects detected on reticles. For example, the embodiments described herein can be used to perform substantially simultaneous inspection and review. In addition, the embodiments described herein can be used to identify defects on reticles that will result in pattern errors on a wafer when printed by an exposure system such as a scanner or stepper.

One embodiment of a method for detecting and classifying defects on a reticle includes acquiring images of the reticle at first and second conditions during inspection of the reticle. The first condition is different than the second condition. In one embodiment, the first and second conditions include different resolutions. For example, one of the conditions may be high resolution, and the other of the conditions may be low resolution. In one such embodiment, acquiring the images of the reticle at the first and second conditions during inspection of the reticle includes altering one or more parameters of imaging optics of an inspection system in an inspection sequence to capture both high resolution images and low resolution images (e.g., images that simulate the images produced in resist by exposure systems or scanners) during the inspection process. The imaging optics may be configured as described further herein, and the inspection sequence may be performed as described further herein.

Acquiring the images may be performed in a number of different manners. For example, acquiring the images in the embodiments described herein may include generating the images of the reticle at the first and second conditions. In another example, acquiring the images in the embodiments described herein may include generating the images of the reticle at the first and second conditions optically, by simulation, some combination of optical imaging and manipulation of the optical imaging results, or some combination thereof. The images of the reticle at the first and second conditions may be generated in such manners using any of the systems described further herein. In an additional example, acquiring the images in the embodiments described herein may include acquiring the images from another method or system that generated the images of the reticle at the first and second conditions. In this manner, the embodiments described herein may or may not include generating the images of the reticle at the first and second conditions. The images of the reticle at the first and second conditions acquired and used by the embodiments described herein may have any suitable image format known in the art. In other words, the embodiments described herein are not limited with respect to the types of images that may be used in the embodiments.

The method also includes detecting the defects on the reticle using one or more of the images acquired at the first condition. For example, one or more of the images of the reticle acquired at the first condition (which may also be referred to as one or more test images) may be compared to one or more reference images. The reference image(s) may include any suitable reference image(s) known in the art. Differences between the one or more test images and the one or more reference images may be compared to a threshold, and differences above the threshold may be identified as defects. In addition, the method includes classifying an importance of the defects detected on the reticle using one or more of the images acquired at the second condition. Classifying the importance of the defects may be performed as described further herein.

The detecting and classifying steps described above are performed substantially simultaneously during the inspection. In this manner, the method includes detecting and classifying defects substantially simultaneously during the inspection process by using two or more images taken under different conditions: one or more of which are used to detect the defects and others of which are used to classify the importance of the defects. As such, the high and low resolution images may be used by the method to identify defects (e.g., with an inspection algorithm) and simultaneously disposition the defects during the inspection process thereby allowing the inspection system to operate at relatively high sensitivity without producing an excessive number of nuisance defects. In addition, because the simulated effect of the defects at the wafer level can be quantified as described further herein, the simultaneous review process may provide an importance estimate that users may use to visually audit the results as a function of the importance estimate determined by the embodiments described herein (e.g., using an inspection system).

In contrast, in the past, defect detection and review (to disposition detected defects) have been performed as separate steps in the inspection process. However, in the embodiments described herein, defect detection and review may be combined as described above so that the power of the defect detection and review algorithms can use both improved review images that simulate the image of the reticle that will be printed on a wafer in conjunction with the high resolution images of the defect to determine its importance. This approach allows inspection to be performed with high resolution images and relatively sensitive defect detection thresholds, improved defect dispositioning, reduced inspection plus review time, and reduced dependence on the operator.

In one embodiment, the first condition includes high resolution, and the second condition includes low resolution. In this manner, the method may include detecting the defects on the reticle using one or more of the images acquired at high resolution and classifying the importance of the defects detected on the reticle using one or more of the images acquired at low resolution. For example, a defect may be detected by comparing high resolution test and reference images, and the classifying step may include comparing features in an area of a low resolution image such as a simulated exposure system (e.g., scanner) image corresponding to the defect to determine whether the defect is likely to produce a pattern error when printed on the wafer. Determining whether defects are likely to produce pattern errors when printed on a wafer may be determined based on one or more characteristics of the defects such as size, shape, location, etc. and one or more characteristics of the features such as size, shape, location, etc. For instance, defects that have a size that is greater than some percentage of the size of the features may be determined to be likely to produce pattern errors when printed on the wafer. In addition, the classifying step may include determining the importance of the defects based on whether the defects are likely to produce pattern errors when the reticle pattern is printed on the wafer. For example, defects that are likely to produce pattern errors may be assigned a higher importance than defects that are not likely to produce pattern errors.

In some embodiments, detecting the defects includes detecting the defects on the reticle using two or more of the images acquired at the first and second conditions. In this manner, the method may include detecting defects on the reticle using both high and low resolution images. For example, only defects that appear at substantially the same position in both the low and high resolution images may be identified as defects. In one such embodiment, the low resolution (e.g., exposure system simulation) images may be used as part of the traditional post-inspection review process in which defects are reviewed after detection using high resolution images or the above described simultaneous high and low resolution inspection process. Such an embodiment may be advantageous since the user may change the focus and exposure conditions used to acquire images of the defects to determine the printability of the defects through the process window of the exposure system (or scanner).

In a different embodiment, the first condition includes low resolution, and the second condition includes high resolution. In this manner, the method may include detecting the defects on the reticle using one or more of the images acquired at low resolution and classifying the importance of the defects detected on the reticle using one or more of the images acquired at high resolution. In one such embodiment, the method may include combining two or more low resolution images (possibly with additional analytical analysis) to simulate the image formed in resist by an exposure system (e.g., a scanner), using the combined images to identify defects, and using one or more high resolution images to classify the defects. The two or more low resolution images may be combined as described further herein to simulate an image formed in resist.

In some embodiments, one of the first and second conditions includes high resolution, and another of the first and second conditions simulates an image of the reticle that will be printed on the wafer. For example, detecting the defects may be performed using one or more of the images acquired at high resolution, and classifying the importance of the defects may be performed using one or more of the images that simulate an image of the reticle that will be printed on the wafer. In this manner, the method may include using one or more high resolution images to identify candidate defects and using low resolution images simulating the image in resist produced by an exposure system to classify the importance of the defect on the resist image. Alternatively, detecting the defects may be performed using one or more of the images that simulate an image of the reticle that will be printed on the wafer, and classifying the importance of the defects may be performed using one or more of the images acquired at high resolution.

The condition that simulates an image of the reticle that will be printed on the wafer may include the low resolution condition. For example, one or more images may be acquired at a low resolution that is selected such that the image(s) simulate image(s) of the reticle that will be printed on the wafer. In one such example, the image(s) may be acquired using an optical system, which may be configured as described further herein, to simulate the optical conditions at which an image of the reticle will be projected onto the wafer by an exposure system. An image acquired under such optical conditions may be altered (or manipulated) to generate an image of the reticle that would be printed on the wafer. For example, an image acquired under optical conditions substantially equivalent to those under which the reticle will be projected onto the wafer by an exposure system may be used as input to a resist model (which may include any suitable model of a resist to which the pattern on the reticle will be transferred in an exposure or lithography process), and the output of the resist model may be an image that is substantially equivalent to an image of the reticle that will be printed in the resist on the wafer.

In this manner, one of the first and second conditions includes low resolution, and the acquiring step may include acquiring one or more of the images at the low resolution using an optical subsystem that simulates printing of the reticle on a wafer. In one embodiment, therefore, the low resolution simulation of a resist-on-wafer image may be formed entirely by a single optical image that substantially duplicates the illumination at the reticle plane of an exposure system (e.g., scanner). For example, the method may include identifying defects by the above or other inspection methods and using one or more review camera images acquired through an optical subsystem configured to simulate the exposure system's (e.g., scanner's) image of the reticle in resist. Examples of optical subsystems that may be used to acquire such images are illustrated in commonly assigned U.S. Pat. No. 7,027,143 to Stokowski et al. and U.S. Pat. No. 7,123,356 to Stokowski et al. and commonly assigned U.S. patent application Ser. No. 10/619,943 by Peterson et al. filed Jul. 15, 2003, which published as U.S. Patent Application Publication No. 2004/0091142 on May 13, 2004, and Ser. No. 11/314,813 by Kekare et al. filed Dec. 20, 2005, which published as U.S. Patent Application Publication No. 2007/0035728 on Feb. 15, 2007, all of which are incorporated by reference as if fully set forth herein. The embodiments described herein may include any of the step(s) of any of the method(s) described in these patents and patent applications and may be further configured as described in these patents and patent applications.

In another embodiment, one of the first and second conditions includes low resolution, and the acquiring step includes acquiring one or more of the images at the low resolution by using multiple images acquired under different optical conditions to form a single simulated exposure system (e.g., scanner) resist image. In this manner, the low resolution simulation of the resist-on-wafer image may be formed using a series of images taken under various optical conditions to form a single simulated exposure system (e.g., scanner) resist image.

For example, in some instances, the image that will be projected on a wafer using a reticle can be simulated by substantially matching the imaging conditions of the exposure system at the reticle. In particular, the illumination NA, illumination pupil function (which may be configured as described further herein), and the NA of the exposure system at the reticle can be substantially duplicated optically such that the resulting image on a detector (which may be configured as described further herein) will be similar enough to the image on the wafer that the image can be used to determine if a relatively small reticle defect will result in a relatively important printing error on the wafer.

However, today and in the future, exposure systems tend to use water immersion to increase their effective NAs above 1.0 (e.g. to about 1.3). Under these (high NA) conditions the above described simulations no longer accurately predict the image of the reticle at the wafer because the marginal rays are approaching the wafer at substantially shallow angles. To model these high NA effects, phase and transmission filters are inserted in the imaging pupil. Unfortunately, a single filter will not provide adequate correction. As a result, at least three images are required, each with a different pupil. These images can then be combined to create the simulated high NA exposure system image. Depending on the illumination pupil function and polarization, more images with additional pupil functions may be used to generate an adequately precise simulation.

In some embodiments, one of the first and second conditions includes low resolution, and the acquiring step includes acquiring one or more of the images at the low resolution by manipulating one or more images acquired by an optical subsystem configured to simulate projection of the reticle on a wafer to generate one or more images illustrating how the reticle will print in a resist on the wafer. In this manner, the low resolution simulation of the resist-on-wafer image may be formed by a combination of one or more optical images and mathematical modeling using techniques for predicting resist images based on the IC design information and models of the reticle pattern generation process, the scanner optics, and the resist development process. Examples of systems and methods that can be used to perform such techniques are described in commonly assigned U.S. patent application Ser. Nos. 11/154,310 by Verma et al. filed Jun. 16, 2005 and Ser. No. 11/226,698 by Verma et al. filed Sep. 14, 2005, which published as U.S. Patent Application Publication No. 2006/0062445 on Mar. 23, 2006, which are incorporated by reference as if fully set forth herein. The embodiments described herein may include any step(s) of any method(s) described in these patent applications and may to be further configured as described in these patent applications.

In an additional embodiment, one of the first and second conditions includes low resolution, and the acquiring step includes acquiring one or more of the images at the low resolution by manipulating an image acquired by an optical subsystem to simulate printing of the reticle in a resist formed on a wafer at different exposure conditions. In one such embodiment, the method includes manipulating images (e.g., review camera images), optically or analytically, to quantify the importance of a defect over the process window of the exposure system (e.g., scanner). Such manipulation of the images may be performed as described further herein.

In some embodiments, the first condition includes low resolution, the second condition includes high resolution, and the acquiring step includes acquiring one or more of the images at the low resolution by using multiple images acquired under different optical conditions to form a single simulated scanner resist image. In this manner, the defects are detected on the reticle using one or more of the images acquired at low resolution, and each of the one or more images acquired at the low resolution is acquired by using multiple images acquired under different optical conditions to form a single simulated scanner resist image. In such an embodiment, the importance of the defects is classified using one or more of the images acquired at the high resolution. Each of these steps may be performed as described herein.

In another embodiment, one of the first and second conditions includes low resolution, and the acquiring step includes generating one or more of the images at the low resolution by simulating processes for manufacturing the reticle, projecting the reticle onto a wafer, and developing a resist on the wafer. Simulating such processes to generate one or more of the images at the low resolution may be performed using systems and methods described in the above-referenced commonly assigned patent applications by Verma et al., which are incorporated by reference as if fully set forth herein.

In a further embodiment, the first condition includes low resolution, the second condition includes high resolution, and the defects include slowly-varying phase defects. In this manner, detecting the defects may be performed using one or more images acquired at low resolution, classifying the importance of the defects may be performed using one or more images acquired at high resolution, and the defects include slowly-varying phase defects. As such, the inspection processes described above in which high resolution images are used first for detection and then low resolution images are used for review or classification may be reversed. In particular, the method may include using the low resolution (e.g., exposure system simulation) images to identify defects in the inspection step and the high resolution images for the simultaneous review process. This approach will be most effective for certain types of defects such as slowly-varying phase defects.

In another embodiment, the second condition includes low resolution, and one or more of the images acquired at the low resolution simulate printing of the reticle on a wafer at different exposure conditions. In one such embodiment, classifying the importance of the defects includes determining printability of the defects at the different exposure conditions using the one or more images acquired at the low resolution and determining the importance based on the printability of the defects at the different exposure conditions. The printability may be determined using the methods and systems described in the patents and patent applications incorporated by reference herein. The importance of the defect may be determined to be high if the defect is determined to print on the wafer at exposure conditions relatively close to a center of a process window, and the importance of the defect may be determined to be low if the defect is determined to not print on the wafer at exposure conditions relatively close to a center of a process window.

In some embodiments, the classifying step includes determining a pattern error that will be produced by the defects when the reticle is printed on a wafer. The pattern error may be determined for defects that are determined to be printable. For example, the classifying step may include determining one or more characteristics of a defect that is determined to be printable using one or more of the images described herein (e.g., the low and/or high resolution defects). In one such example, the low and/or high resolution images may be used to determine characteristics of the defects such as size, shape, location, location with respect to patterned features of the reticle, size, shape, location of the patterned features of the reticle as a result of the defects, etc. One or more of these characteristics can then be used to determine what kind of pattern errors the defects will produce on the wafer (e.g., a bridging pattern error, a missing patterned feature error, etc.).

In another embodiment, the classifying step includes determining the importance of the defects based on sizes of the defects, MEEFs of areas of the reticle in which the defects are located, and effects of the defects on printing of the reticle on a wafer. The sizes of the defects may be determined in any suitable manner using the low and/or high resolution images. The areas of the reticle in which the defects are located and the MEEFs associated with those areas may be determined in any suitable manner (e.g., using the low and/or high resolution images, information about the reticle design such as information from a design database, etc.). The effects of the defects on the printing of the reticle on the wafer may be determined in any suitable manner (e.g., as described herein using the low and/or high resolution images). In one such example, if a reticle defect is relatively small or is located in a relatively low MEEF area of the pattern and if the effect of the defect on the wafer pattern is determined to be relatively insignificant, the importance of the defect may be classified as low. In another such example, if a reticle defect is determined to be located in a relatively high MEEF area of the pattern and if the effect of the defect on the wafer pattern is determined to be relatively significant, then the importance of the defect may be classified as high.

In a further embodiment, the method includes generating a list of the defects detected on the reticle and removing defects classified as having low importance from the list. For example, if a reticle defect is too small or is located in a relatively low MEEF area of the pattern and if the modeled effect of the defect on the wafer pattern is determined to be relatively insignificant, the defect may be removed from the defect list. However, if the defect is determined to result in a significant printing error on the wafer, the defect may be included in the list. The defect list may have any suitable format known in the art and may include any suitable information about the defects.

Each of the embodiments of the method described above may include any other step(s) of any other embodiment(s) described herein. In addition, each of the embodiments of the method described above may be performed by any of the systems described herein.

As described above, detecting defects on a reticle and classifying the importance of the defects detected on the reticle may be performed substantially simultaneously using images of the reticle acquired at different resolutions. Another embodiment of a method for detecting and classifying defects on a reticle may include using images acquired at different resolutions for defect detection and defect importance classification, which may or may not be performed substantially simultaneously.

In particular, another embodiment of a method for detecting and classifying defects on a reticle includes acquiring images of the reticle at low and high resolutions during inspection of the reticle, which may be performed as described further herein. The method also includes detecting the defects on the reticle using one or more of the images acquired at the high resolution. Detecting the defects on the reticle in this step may be performed as described further herein. In addition, the method includes classifying the importance of the defects detected on the reticle using one or more of the images acquired at the low resolution. Classifying the importance of the defects in this manner may be performed as described further herein. In one such embodiment, the detecting and classifying steps are performed substantially simultaneously during the inspection. Detecting the defects and classifying the importance of the defects may be performed substantially simultaneously as described further herein.

In some embodiments, the one or more images acquired at the low resolution simulate printing of the reticle on the wafer. Such images may be acquired as described further herein. In another embodiment, the one or more images acquired at the low resolution illustrate how the reticle will be printed on a wafer at different exposure conditions. Such images may be acquired as described further herein. In one such embodiment, classifying the importance of the defects includes determining printability of the defects at the different exposure conditions using the one or more images acquired at the low resolution and determining the importance based on the printability of the defects at the different exposure conditions. Determining the printability of the defects in this manner may be performed as described further herein. In addition, determining the importance based on the printability may be performed as described further herein.

Each of the embodiments of the method described above may include any other step(s) of any other embodiment(s) described herein. In addition, each of the embodiments of the method described above may be performed by any of the systems described herein.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. For example, after the method classifies the importance of the defects, the method may include displaying the classifications of the defects for user verification. In another example, after the method classifies the importance of the defects, the classifications of the defects can be used by the embodiments described herein, another method, another system, or some combination thereof to determine if the reticle is usable, if the reticle should be repaired (e.g., to repair one or more of the defects detected on the reticle), or if the reticle should be scrapped and re-made. In an additional example, the classifications of the defects may be stored in a storage medium of a reticle repair system such that the reticle repair system can access the classification information to perform a reticle repair process and/or to setup a reticle repair recipe based on the classification information. Furthermore, the results may be stored "permanently," "semi-permanently," temporarily, or for some period of time. For example, the storage medium may be random access memory (RAM), and the results may not necessarily persist indefinitely in the storage medium.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

FIG. 1 illustrates one embodiment of a system configured to detect and classify defects detected on a reticle. The system includes an optical subsystem configured to acquire images of the reticle at first and second conditions during inspection of the reticle. The first condition is different than the second condition. In some embodiments, the so optical subsystem may be configured to provide flexible illumination modes of a reticle. For example, as shown in FIG. 1, light 10 may be directed to optical element 12, which may be configured to control a mode of illumination used to acquire images of reticle 14. Light 10 may have any suitable wavelength (e.g., at least one wavelength of which may be approximately equal to that of an exposure system that will be used to print the reticle on wafers). The optical subsystem may include a light source (not shown) that is configured to generate light 10. The light source may include any suitable light source known in the art.

Optical element 12 may be configured to position one of illumination apertures 16 in the optical path of light 10. In one such example, optical element 12 may include a device (not shown) such as a mechanical or robotic assembly configured to move illumination apertures 16 into and out of the optical path of light 10. The device and optical element 12 may have any suitable configuration known in the art. In some embodiments, illumination apertures 16 include illumination aperture 18 configured to provide axial illumination, illumination aperture 20 configured to provide annular illumination, and illumination aperture 22 configured to provide quadrapole illumination. Illumination apertures 16 may include any suitable illumination apertures known in the art and may have any suitable configuration known in the art. In addition, illumination apertures 16 may include some, all, or none of the illumination apertures shown in FIG. 1. Illumination apertures 16 may also include any other suitable illumination apertures known in the art.

In some embodiments, light exiting optical element 12 may be directed to optical element 24, which is configured to alter the level of the light, For example, optical element 24 may include a neutral band (NB) filter or any other suitable optical element configured to reduce the intensity of light 10. In some embodiments, the optical subsystem includes beam splitter 26. Beam splitter 26 may include any suitable beam splitter known in the art. Beam splitter 26 is configured to separate light exiting optical element 24 into two different beams of light. In particular, beam splitter 26 is configured to separate light exiting optical element 24 into light beam 28 that can be used to acquire images of light transmitted through the reticle and light beam 30 that can be used to acquire images of light reflected by the reticle. The beam splitter may be configured to separate light exiting optical element 24 into two different beams of light with any suitable split ratio. For example, the light beams exiting the beam splitter may or may not have the same intensity.

The portion of the optical subsystem that can be used to acquire images of light transmitted through the reticle will now be described. In particular, in some embodiments, the optical subsystem includes polarizer 32 configured to alter the polarization of light beam 28. Polarizer 32 may include any suitable optical element known in the art. The light that passes through polarizer 32 may be directed to illumination pupil 34. One of the illumination apertures described above may be positioned in illumination pupil 34. For example, in some embodiments, the illumination mode may be altered as described above in order to simulate the illumination mode that will be used to project images of the reticle onto a wafer. In this manner, the illumination apertures described above may not be positioned in the optical path of the light beam that is used to acquire images of light reflected from the reticle. For instance, instead of using optical element 12 to position one of illumination apertures 16 in the optical path of light 10, one of illumination apertures 16 may be positioned in illumination pupil 34.

The optical subsystem may include an optical element (not shown) such as a beam splitter, which may be configured as described above, to split the light exiting illumination pupil 34 into two different light beams 36 and 38. The optical subsystem may be configured to direct the two different light beams along two different optical paths for transmitted light-based imaging of reticle 14. In this manner, the optical subsystem may be configured such that each of light beams 36 and 38 may be used independently to acquire images of the reticle using transmitted light. For example, the optical subsystem may include independent transmitted light shutters 40 and 42 positioned in the path of light beams 36 and 38, respectively. The optical subsystem may be configured to independently control light shutters 40 and 42 such that the shutters can be independently moved into the optical paths of the light beams (as shown in phantom in FIG. 1) and out of the optical paths of the light beams. The optical subsystem may be configured to independently control the light shutters in any suitable manner known in the art. Light shutters 40 and 42 may have any suitable configuration known in the art.

Light that is not blocked by shutters 40 and 42 may be directed to reflective optical element 44. Reflective optical element 44 may include any suitable reflective optical element such as a flat or folding mirror. Light reflected by reflective optical element 44 may be directed to wave plate 46. The wave plate may include any suitable wave plate known in the art and may be configured to alter the polarization state of light beams 36 and 38 to any suitable polarization. Light exiting wave plate 46 is directed to illumination zoom 48, which may include any suitable refractive optical element known in the art. In addition, although illumination zoom 48 is shown in FIG. 1 as a single refractive optical element, it is to be understood that illumination zoom 48 may include one or more refractive optical elements and/or one or more reflective optical elements.

Light exiting illumination zoom 48 may be directed to reticle 14, which may include any suitable reticle known in the art. Light exiting reticle 14 passes through image zoom 50, which may include any suitable refractive optical element known in the art. In addition, although image zoom 50 is shown in FIG. 1 as a single refractive optical element, it is to be understood that image zoom 50 may include one or more refractive optical elements and/or one or more reflective optical elements. Light exiting image zoom 50 may pass through intermediate image focal plane (IFP) 52 in which one or more optical elements (not shown) may be positioned. The one or more optical elements positioned in the IFP may include any suitable optical element(s) known in the art.

Light that passes through the IFP may be directed to image analyzer 54. Image analyzer 54 may include beam splitter 56 and focus offset element 58. Light beam 36 that passes through the IFP may be directed through beam splitter 56, and light beam 38 that passes through the IFP may be directed through focus offset element 58. Beam splitter 56 may include any suitable beam splitter known in the art such as a polarizing beam splitter. Beam splitter 56 may be configured such that both light beam 36 and a light beam reflected from the reticle can be directed to a detector as described further herein depending on which type of image (e.g., a transmitted light image or a reflected light image) is being detected. Focus offset element 58 may include any suitable optical element known in the art and may be configured to account for any difference between the optical path lengths of light beams 36 and 38 caused by beam splitter 56 and/or any other optical elements of the optical subsystem.

Light beams 36 and 38 that pass through image analyzer 54 may be directed to lens 60, which may include any suitable lens known in the art. In addition, although lens 60 is shown in FIG. 1 as a refractive optical element, it is to be understood that the lens may include one or more refractive optical elements and/or one or more reflective optical elements. Light that passes through lens 60 may be directed to polarizers 62 and 64. In particular, light beam 36 that passes through lens 60 is directed to polarizer 62, and light beam 38 that passes through lens 60 is directed to polarizer 64. Polarizers 62 and 64 may include any suitable polarizers known in the art. In addition, polarizers 62 and 64 may be similarly configured polarizers or differently configured polarizers.

Light beam 36 exiting polarizer 62 is directed to image pupil 66, and light beam 38 exiting polarizer 64 is directed to image pupil 68. In some embodiments, the image pupils may have different pupil functions. For example, as shown in FIG. 1, one of image pupils 66 and 68 may have one of pupil functions 70 and 72, and the other of the image pupils may have the other pupil function. In addition, although two examples of different pupil functions that the image pupils may have are shown in FIG. 1, it is to be understood that the pupil functions of the image pupils may include any suitable pupil functions known in the art.

Light exiting image pupils 66 and 68 is directed to lens 74, which may include any suitable lens known in the art. In addition, although lens 74 is shown in FIG. 1 as a refractive optical element, it is to be understood that the lens may include one or more refractive optical elements and/or one or more reflective optical elements. Light that passes through lens 74 is directed to detector 76. Detector 76 may include any suitable imaging detector known in the art such as a charge coupled device (CCD) or time delay integration (TDI) camera. Detector 76 is configured to generate output responsive to the images of the reticle.

The portion of the optical subsystem that can be used to acquire images of light reflected by the reticle will now be described. In particular, as described above, beam splitter 26 is configured to separate light exiting optical element 24 into light beam 28 that can be used to acquire images of light transmitted through the reticle and light beam 30 that can be used to acquire images of light reflected by the reticle. As shown in FIG. 1, light beam 30 exiting beam splitter 26 may be directed to reflective optical element 78, which may be any suitable reflective optical element known in the art such as a flat mirror or a folding mirror. Light beam 30 reflected by reflective optical element 78 is directed through illumination pupil 80, which may have any suitable configuration known in the art.

The optical subsystem may include reflected path light shutter 82, which may be positioned in the path of light beam 30 that passes through illumination pupil 80. The optical subsystem may be configured to control light shutter 82 such that the shutter can be moved into the optical path of the light beam (as shown in phantom in FIG. 1) and out of the optical path of the light beam. The optical subsystem may be configured to control the light shutter in any suitable manner known in the art. Reflected light shutter 82 may have any suitable configuration known in the art.

If shutter 82 is not positioned in the optical path of the light exiting the illumination pupil, light beam 30 is directed to beam splitter 56. Beam splitter 56 is configured to reflect light beam 30 such that the light beam reflected by the beam splitter is directed through IFP 52, image zoom 50, and onto reticle 14. Light beam 30 reflected by the reticle passes back through image zoom 50, IFP 52, and beam splitter 56. The reflected light beam may then pass through lens 60, polarizer 62, image pupil 66, and lens 74. Lens 74 may be configured to direct the reflected light beam to detector 76 such that the detector can generate an image of the light reflected by the reticle.

The optical subsystem described above may be further configured as described herein. For instance, in one embodiment, the optical subsystem is configured such that an image generated by the detector simulates an image of the reticle that will be printed on a wafer. In one such embodiment, one or more parameters of the transmitted light portion of the optical subsystem are configured to be substantially equivalent to one or more parameters of an exposure system that will be used to project an image of the reticle onto a wafer. Such parameters may include, for example, the wavelength of the light the partial coherence of the subsystem, the polarization of the light projected on the reticle, the NA of the subsystem on the reticle side and the object side, etc. In this manner, one or more of the images may be acquired at low resolution for a reticle using the optical subsystem shown in FIG. 1, which simulates printing of the reticle on a wafer. In addition, the optical subsystem may be configured to acquire one or more images of the reticle at the low resolution by simulating printing of the reticle on a wafer at different exposure conditions. For instance, the focus setting of the optical subsystem may be altered for acquisition of different images at different focus settings, which may simulate different focus settings of an exposure system that will be used to project an image of the reticle on a wafer. The optical subsystem may be further configured as described herein.

The system may also include processor 84 coupled to detector 76. Processor 84 may be coupled to the detector in any suitable manner (e.g., via one or more transmission media, via one or more elements (not shown) interposed between the processor and the detector, etc., or some combination thereof). In this manner, processor 84 may be configured to receive output generated by the detector. In particular, processor 84 may be configured to receive output responsive to the images of the reticle generated by the detector. As such, the processor may be configured to acquire the images generated by the detector.

The processor may be configured to perform one or more steps of the method embodiments described herein. For example, the processor may be configured to detect defects on the reticle using one or more of the images acquired at the first condition. The processor may be configured to detect the defects in this manner as described further herein. The processor may also be configured to classify an importance of the defects detected on the reticle using one or more of the images acquired at the second condition. The processor may be configured to classify the defects as described further herein. For instance, in one embodiment, the processor may be configured to classify the defects by determining printability of the defects at different exposure conditions using the one or more images acquired at the low resolution and determining the importance based on the printability of the defects at the different exposure conditions. In another embodiment, the processor is configured to classify the defects by determining a pattern error that will be produced by the defects when the reticle is printed on a wafer. In a further embodiment, the processor is configured to classify the defects by determining the importance of the defects based on sizes of the defects, MEEFs of areas of the reticle in which the defects are located, and effects of the defects on printing of the reticle on a wafer. In addition, the optical subsystem and the processor may be configured such that the defects can be detected and the importance of the detected defects can be classified substantially simultaneously.

The processor may be configured to perform any other step(s) of any other embodiment(s) described herein. For instance, in one embodiment, the processor is configured to acquire one or more of the images at the low resolution by using multiple images acquired under different optical conditions (e.g., using the optical subsystem) to form a single simulated exposure system (e.g., scanner) resist image. In another embodiment, the processor is configured to generate a list of the defects detected on the reticle and to remove defects classified as having low importance from the list. The processor may be configured to generate the list and to remove defects from the list as described further herein.

The processor described above may take various forms, including a personal computer system, mainframe computer system, workstation, network appliance, Internet appliance, imaging computer, or other device. In general, the term "Computer system" may be broadly defined to encompass any device having one or more processors, which executes instructions from a memory medium.

In some embodiments, the system includes simulation engine 86. Simulation engine 86 may be coupled to detector 76. Simulation engine 86 may be coupled to the detector in any suitable manner (e.g., via one or more transmission media, via one or more elements (not shown) interposed between the simulation engine and the detector, etc., or some combination thereof). In this manner, simulation engine 86 may be configured to receive output generated by the detector. In particular, simulation engine 86 may be configured to receive output responsive to the images of the reticle generated by the detector. As such, the simulation engine may be configured to acquire the images generated by the detector. The simulation engine may include any suitable hardware and/or software known in the art that can be configured to perform one or more of the steps described herein.

The simulation engine may be configured to manipulate one or more images generated by the detector according to any of the embodiments described herein. For instance, in one embodiment, the simulation engine is configured to manipulate one or more images acquired by the optical subsystem, which is configured to simulate projection of the reticle on a wafer, to generate one or more images illustrating how the reticle will print in a resist formed on the wafer. The simulation engine may manipulate the image(s) in this manner as described further herein. In another embodiment, the simulation engine is configured to manipulate an image acquired by the optical subsystem to simulate printing of the reticle in a resist formed on a wafer at different exposure conditions. The simulation engine may manipulate the image as described further herein. In an additional embodiment, the simulation engine is configured to generate one or more of the images at the low resolution by simulating processes for manufacturing the reticle, projecting the reticle onto a wafer, and developing a resist on the wafer, which may be performed as described further herein. The simulation engine may also be coupled to the processor. The simulation engine may be coupled to the processor in any suitable manner such that the images generated by the simulation engine may be provided to the processor. The processor may be configured to use such images as described further herein.

The system shown in FIG. 1 may also include storage medium 88 in which results of one or more steps of the method performed by the system can be stored as described further above. The results may include, for example, the images acquired by the processor from the detector, information about the defects detected on the reticle, information about the importance of the defects, etc., or some combination thereof. Storage medium 88 may be further configured as described herein.

The images of the reticle at the first and second conditions may be acquired using the system shown in FIG. 1 in a number of different manners. For example, in one embodiment, acquiring an image of the reticle at low resolution may include the steps of the following low NA inspection sequence. The low NA inspection sequence is described for the case of unpolarized illumination. In this sequence, the pixel size of the optical subsystem may be set to about 125 nm or about 150 n. The pixel size of the optical subsystem may be set in any suitable manner know in the art. Transmitted light path shutters 40 and 42 may be opened, and reflected light path shutter 82 may be closed. Illumination pupil 34 may be set to the desired partial coherence (e.g., sigma) and shape. Optical element 12 may be set to the patch pupil shape. Wave plate 46, which in this instance may be a circular to linear wave plate, may be retracted at the input to imaging zoom 48.

The sequence may also include turning off the image polarization analyzers. In addition, the sequence may include inserting polarizers (e.g., polarizers 62 and 64, respectively) before pupils 66 and 68. The pupil size may be set to match the exposure system's (e.g., scanner's) NA. An "fxx (r)" pupil function may be inserted in pupil 66, and an "fxy (r)" pupil function may be inserted in pupil 68. A swath may then be captured, and the acquired swath images may be stored (e.g., in storage medium 88). An "fyx (r)" pupil function may then be inserted in pupil 66, and an "fyy (r)" pupil function may be inserted in pupil 68. A swath may then be captured, and the acquired swath images may be stored. An "fzx (r)" pupil function may then be inserted in pupil 66, and TO an "fzy (r)" pupil function may be inserted in pupil 68. A swath may then be captured, and the acquired swath images may be stored. In this manner, six images may be acquired using six different pupil functions. All six images may be aligned to each other and summed. The summed images may then be saved in storage medium 88 (e.g., "to disk").

In some embodiments, acquiring an image of the reticle at high resolution may include the steps of the following high NA inspection sequence and simultaneous review and dispositioning. For example, the pixel size of the optical subsystem may be set to about 56 nm, which may be performed in any suitable manner known in the art. The reflected and transmitted light shutters 40, 42, and 82 may be opened. The split ratio may be set for reflected light and transmitted light inspection (e.g., at beam splitter 26). Illumination pupil 34 may be set to full for the transmitted light. The mode of the optical subsystem may be set to Gaussian using illumination apertures 16 and optical element 12. The illumination may be set to circular polarization using polarizer 32. Wave plate 46, which may be a circular to linear wave plate, may be set at the imaging zoom. Image polarization analyzers (e.g., polarizers 62 and 64) may be turned on. Full NA pupils may be inserted at both pupils 66 and 68. Reflected and transmitted light images may be captured at high NA, and corresponding low NA images, which may have been generated and stored as described above, may be read from disk. Defects may then be detected using the high NA test and reference images. The corresponding low NA images may be used to determine whether the high NA detected defects print. For defects that print, the images (e.g., thumb nail images) may be saved.

As described above, therefore, a system configured to perform one or more embodiments of the methods described herein may be configured to acquire the images by generating the images of the reticle (e.g., by optically imaging the reticle). However, in other embodiments, a system configured to perform one or more of the embodiments of the methods described herein may be configured to acquire the images of the reticle without imaging the reticle. For example, the system may be configured to acquire the images of the reticle from a system such as that shown in FIG. 1 (e.g., from storage medium 88 of the system shown in FIG. 1).

Figure 2:
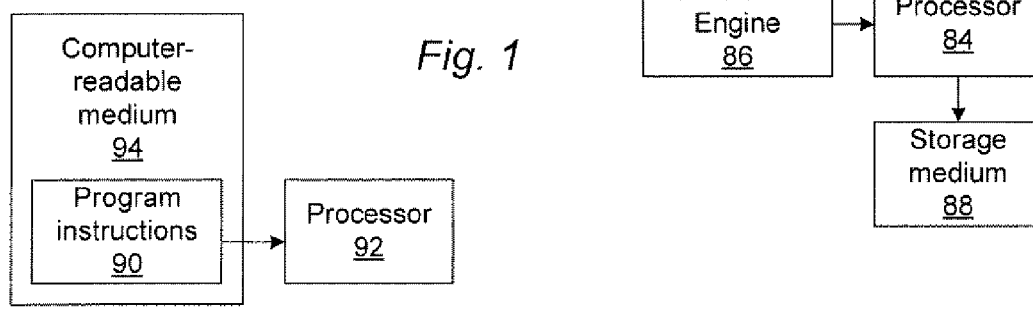
FIG. 2 is a block diagram illustrating another embodiment of a system configured to detect and classify defects on a reticle.

One embodiment of such a system configured to perform one or more of the embodiments of the methods described herein is shown in FIG. 2. As shown in FIG. 2, the system may include program instructions 90 executable on processor 92 to perform any computer-implemented method(s) or method (s) described herein. The processor may be configured to perform one or more steps of one or more of the computer-implemented methods or methods described herein. The processor may be further configured as described herein. In one embodiment, the system may be a stand-alone system. In another embodiment, the system may be part of, or coupled to, an inspection system such as the system shown in FIG. 1 described above. In yet another embodiment, the system may be coupled to a fab database. The system may be coupled to an inspection system and/or a fab database by a transmission medium such as a wire, a cable, a wireless transmission path, and/or a network. The transmission medium may include "wired" and "wireless" portions.

Program instructions 90 for implementing computer-implemented methods such as those described herein may be transmitted over or stored on computer-readable medium 94.

The computer-readable medium may be a transmission medium such as a wire, cable, or wireless transmission link. The computer-readable medium may also be a storage medium such as a read-only memory, a random access memory, a magnetic or optical disk, or a magnetic tape.

The program instructions may be implemented in any of various ways, including procedure-based techniques, component-based techniques, and/or object-oriented techniques, among others. For example, the program instructions may be implemented using Matlab, Visual Basic, ActiveX controls, C, C++ objects, C#, JavaBeans, Microsoft Foundation Classes ("MFC"), or other technologies or methodologies, as desired.

Further modifications and alternative embodiments of various aspects of the invention may be apparent to those skilled in the art in view of this description. For example, methods for detecting and classifying defects on a reticle are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for detecting and classifying defects on a reticle, comprising:
   acquiring images of the reticle at first and second conditions during inspection of the reticle, wherein the first condition is different than the second condition;
   detecting the defects on the reticle using one or more of the images acquired at the first condition; and
   classifying an importance of the defects detected on the reticle using one or more of the images acquired at the second condition, wherein said detecting and said classifying are performed substantially simultaneously during the inspection.

2. The method of claim 1, wherein the first and second conditions comprise different resolutions.

3. The method of claim 1, wherein the first condition comprises high resolution, and wherein the second condition comprises low resolution.

4. The method of claim 1, wherein the first condition comprises low resolution, and wherein the second condition comprises high resolution.

5. The method of claim 1, wherein one of the first and second conditions comprises high resolution, and wherein another of the first and second conditions simulates an image of the reticle that will be printed on a wafer.

6. The method of claim 1, wherein one of the first and second conditions comprises low resolution, and wherein said acquiring comprises acquiring one or more of the images at the low resolution using an optical subsystem that simulates printing of the reticle on a wafer.

7. The method of claim 1, wherein one of the first and second conditions comprises low resolution, and wherein said acquiring comprises acquiring one or more of the images at the low resolution by using multiple images acquired under different optical conditions to form a single simulated scanner resist image.

8. The method of claim 1, wherein one of the first and second conditions comprises low resolution, and wherein said acquiring comprises acquiring one or more of the images at the low resolution by manipulating one or more images acquired by an optical subsystem configured to simulate projection of the reticle on a wafer to generate one or more images illustrating how the reticle will print in a resist formed on the wafer.

9. The method of claim 1, wherein one of the first and second conditions comprises low resolution, and wherein said acquiring comprises acquiring one or more of the images at the low resolution by manipulating an image acquired by an optical subsystem to simulate printing of the reticle in a resist formed on a wafer at different exposure conditions.

10. The method of claim 1, wherein the first condition comprises low resolution, wherein the second condition comprises high resolution, and wherein said acquiring comprises acquiring one or more of the images at the low resolution by using multiple images acquired under different optical conditions to form a single simulated scanner resist image.

11. The method of claim 1, wherein one of the first and second conditions comprises low resolution, and wherein said acquiring comprises generating one or more of the images at the low resolution by simulating processes for manufacturing the reticle, projecting the reticle onto a wafer, and developing a resist on the wafer.

12. The method of claim 1, wherein the first condition comprises low resolution, wherein the second condition comprises high resolution, and wherein the defects comprise slowly-varying phase defects.

13. The method of claim 1, wherein said detecting comprises detecting the defects on the reticle using two or more of the images acquired at the first and second conditions.

14. The method of claim 1, wherein the second condition comprises low resolution, wherein one or more of the images acquired at the low resolution simulate printing of the reticle on a wafer at different exposure conditions, and wherein said classifying comprises determining printability of the defects at the different exposure conditions using the one or more of the images acquired at the low resolution and determining the importance based on the printability of the defects at the different exposure conditions.

15. The method of claim 1, wherein said classifying comprises determining a pattern error that will be produced by the defects when the reticle is printed on a wafer.

16. The method of claim 1, wherein said classifying comprises determining the importance of the defects based on sizes of the defects, mask error enhancement factors of areas of the reticle in which the defects are located, and effects of the defects on printing of the reticle on a wafer.

17. The method of claim 1, further comprising generating a list of the defects detected on the reticle and removing defects classified as having low importance from the list.

18. A method for detecting and classifying defects on a reticle, comprising:
   acquiring images of the reticle at low and high resolutions during inspection of the reticle;
   detecting the defects on the reticle using one or more of the images acquired at the high resolution; and
   classifying an importance of the defects detected on the reticle using one or more of the images acquired at the low resolution.

19. The method of claim 18, wherein said detecting and said classifying are performed substantially simultaneously during the inspection.

20. The method of claim 18, wherein the one or more of the images acquired at the low resolution simulate printing of the reticle on a wafer.

21. The method of claim 18, wherein the one or more of the images acquired at the low resolution illustrate how the reticle will be printed on a wafer at different exposure conditions, and wherein said classifying comprises determining printability of the defects at the different exposure conditions using the one or more of the images acquired at the low resolution and determining the importance based on the printability of the defects at the different exposure conditions.

* * * * *